United States Patent [19]
Bell

[11] Patent Number: 5,942,937
[45] Date of Patent: Aug. 24, 1999

[54] SIGNAL DETECTION CIRCUIT USING A PLURALITY OF DELAY STAGES WITH EDGE DETECTION LOGIC

[75] Inventor: Russell Bell, Austin, Tex.

[73] Assignee: Advanced Micro Devices, Inc., Sunnyvale, Calif.

[21] Appl. No.: 08/974,672

[22] Filed: Nov. 19, 1997

[51] Int. Cl.[6] ............................. H03D 5/00; H03H 11/26
[52] U.S. Cl. ....................... 329/303; 327/270; 327/271; 329/310; 329/336; 329/343; 329/363
[58] Field of Search .................... 329/341, 343, 329/303, 310, 363, 336; 327/258, 259, 269, 270, 271, 272; 331/45, 60

[56] References Cited

U.S. PATENT DOCUMENTS

| | | | |
|---|---|---|---|
| 4,706,040 | 11/1987 | Mehrgardt | 331/25 |
| 4,975,605 | 12/1990 | Bazes | 327/251 |
| 5,087,829 | 2/1992 | Ishibashi et al. | 327/270 |
| 5,132,572 | 7/1992 | Woo | 307/475 |
| 5,220,216 | 6/1993 | Woo | 307/469 |
| 5,227,679 | 7/1993 | Woo | 307/469 |
| 5,264,745 | 11/1993 | Woo | 307/475 |
| 5,349,612 | 9/1994 | Guo et al. | 375/118 |
| 5,363,419 | 11/1994 | Ho | 375/120 |
| 5,367,542 | 11/1994 | Guo | 375/110 |
| 5,400,370 | 3/1995 | Guo | 375/118 |
| 5,452,333 | 9/1995 | Guo et al. | 375/371 |
| 5,457,336 | 10/1995 | Fang et al. | 257/322 |
| 5,457,719 | 10/1995 | Guo et al. | 375/373 |

*Primary Examiner*—Siegfried H. Grimm

[57] ABSTRACT

A signal detection circuit employs a delay line with edge detection logic for capturing and buffering timing information about an input signal. A plurality of comparators for comparing the input signal to different reference potentials capture amplitude information in the input signal launching bits into respective delay lines. Preferably, each delay line includes a counter for counting detected bit edges.

35 Claims, 8 Drawing Sheets

NON-INVERTING DELAY STAGE 210

CALIBRATE

INVERTING DELAY STAGE 220

CALIBRATE

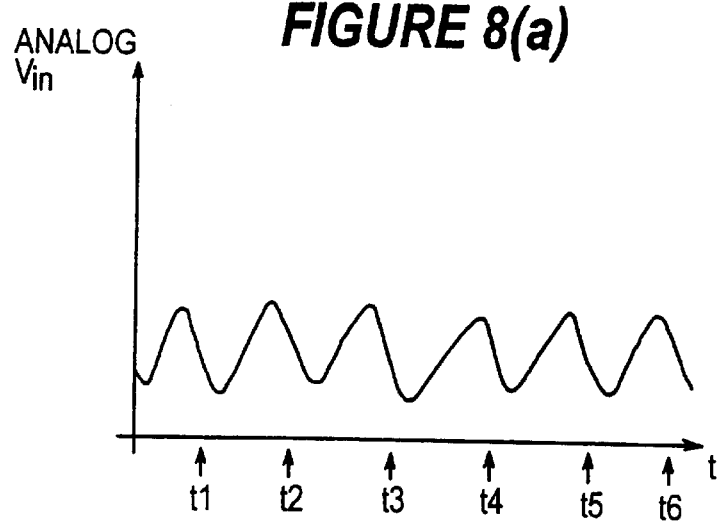
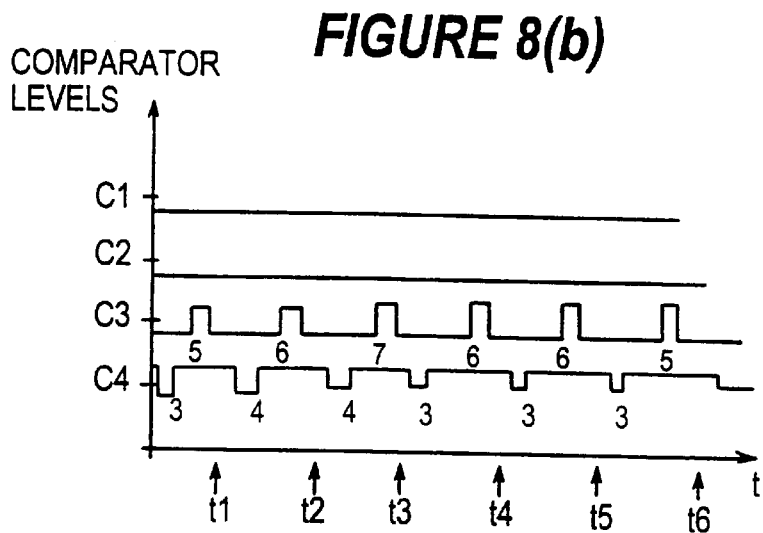
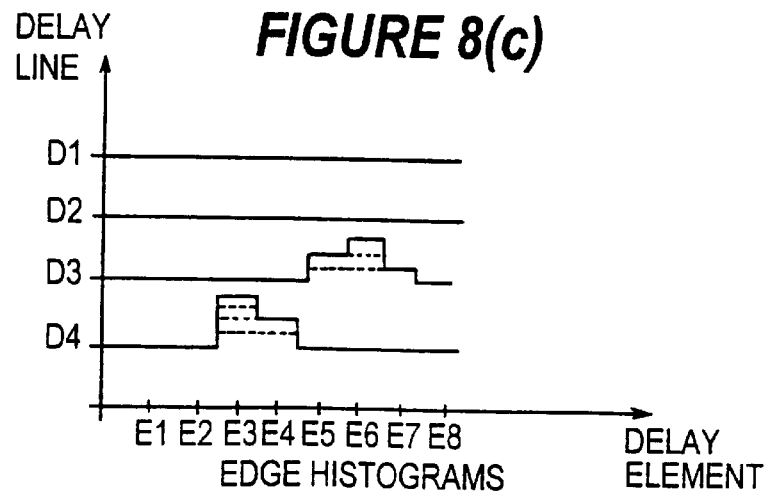

SIGNAL DETECTION CIRCUIT USING A PLURALITY OF DELAY STAGES WITH EDGE DETECTION LOGIC

RELATED APPLICATION

This application is related to the commonly assigned, U.S. patent application Ser. No. 08/964,857, entitled "Squelch Circuit and Methodology for a Multilevel Quantizer" filed on Nov. 5, 1997 by Russell Bell.

TECHNICAL FIELD

The present invention relates to signal detection and demodulation and, more particularly, to a scalable, generic demodulation circuit and methodology.

BACKGROUND ART

Modulation is fundamental to electrical communications. There is a variety of different modulation techniques known in the art for embedding a signal in a carrier wave. For example, in amplitude modulation (AM), the signal is encoded by variations in the amplitude of the carrier wave. As another example, a genus of modulation techniques called "angle modulation," encodes the signal with variations in the instantaneous angle or timing of the carrier wave. Two common species of angle modulation are frequency modulation (FM), in which the instantaneous frequency of the carrier wave is varied, and phase modulation (PM), in which the instantaneous phase of the carrier wave is changed. Other well-known examples of angle modulation are frequency shift keying (FSK) and phase shift keying (PSK) commonly used for digital signals.

Consequently, modulated signals embodied in a carrier wave and transmitted to a receiver circuit must be demodulated or detected in order for the transmitted signal to be recovered. Although a considerable amount of effort has been expended in engineering demodulating circuits, many common conventional demodulation circuits nevertheless exhibit certain disadvantages.

Some conventional signal demodulation circuits are specifically designed to detect a particular kind of modulated signal. However, it is often difficult to realize design savings by reusing the design of the circuit to adapt to a different modulation scheme. A related drawback is that some conventional circuits are difficult to re-engineer to be more sensitive to changes in amplitude or in frequency.

Some conventional demodulation circuits are implemented with multiple, complex analog stages or employ large lumped analog components, such as inductors. Such circuits are difficult to manufacture on a monolithic semiconductor substrate and are therefore difficult to miniaturize.

Some conventional, digital demodulation circuits sample an incoming signal, convert the sampled signal into a digital format, and store the result in a random access memory (RAM) buffer. Other conventional digital demodulation circuits require microprocessor intervention to process the incoming signal. In both these approaches, the data rate of the incoming signal is limited.

DISCLOSURE OF THE INVENTION

There exists a need for a generic signal detector that can work with a variety of modulation techniques. There is also a need for a scalable signal detection design that can readily be adapted to handle new specifications for amplitude or timing parameters, such as frequency or phase. Furthermore, there is a need for a high speed digital signal detector that does not require a RAM buffer or processor intervention.

These and other needs are met by the present invention, in which a delay line with edge detection logic captures and buffers timing information about an input signal. A plurality of comparators and corresponding delay lines are used to capture and buffer amplitude information for the input signal. Capturing and buffering both amplitude and timing information of an incoming signal allow signals encoded according to one or a combination of modulation techniques to be detected.

Accordingly, one aspect of the present invention comprises serially coupled delay stages, which can be inverting or non-inverting delay stages. Edge detection logic coupled to an input and output of a delay stage is configured to output a signal indicative of an edge in a digital signal applied to the delay stages. The serially coupled delay stages allow the digital signal to be repeatedly delayed and buffered with RAM or processor intervention, and the edge detection logic allows timing information to be captured. Consequently, angle modulated signals can be detected.

According to another aspect of the present invention, a circuit for detecting an input signal comprises one or more comparators for generating pulses based on a comparison of the input signal and one or more respective reference potentials. One or more digital delay lines are coupled to the comparators for delaying the pulses and generating signals indicative of detected edges in the pulses. Thus, use of comparators with a corresponding delay line allows amplitude information in the input signal to be captured and buffered. Consequently both amplitude and angle modulated signals can be detected.

Another aspect of the invention is a method of detecting a signal, which has a step of comparing the signal to a plurality of reference potentials and, in response, producing from the comparisons corresponding pulses. The pulses are repeatedly delayed by a common delay period, and edges in the pulses are detected.

Preferably, the detected edges are counted based on a clock signal, for example, by a counter coupled to the edge detection logic.

Additional objects, advantages, and novel features of the present invention will be set forth in part in the detailed description which follows, and in part will become apparent upon examination or may be learned by practice of the invention. The objects and advantages of the invention may be realized and obtained by means of the instrumentalities and combinations particularly pointed out in the appended claims.

BRIEF DESCRIPTION OF DRAWINGS

The present invention is illustrated by way of example, and not by limitation, in the figures of the accompanying drawings, wherein elements having the same reference numeral designations represent like elements throughout and wherein:

FIGS. 8(a) to 8(c) are graphs illustrating an operation of the embodiment of the invention depicted in FIG. 6.

BEST MODE FOR CARRYING OUT THE INVENTION

A circuit and method for detection of a signal are described. In the following description, for purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

MULTI-LEVEL QUANTIZER

Figure 1:
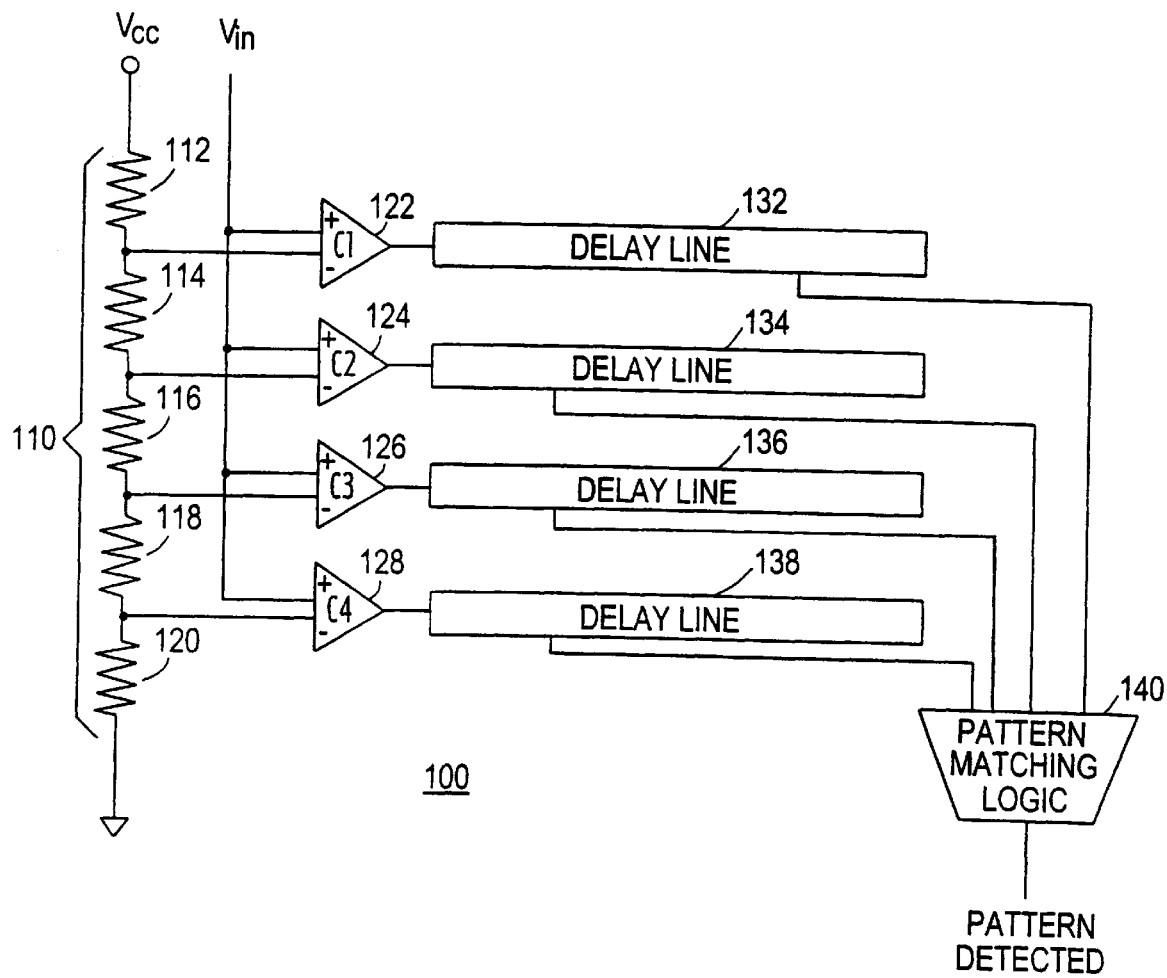
FIG. 1 is a circuit diagram of a signal detection circuit according to one embodiment.

Referring to FIG. 1, one embodiment of the present invention employs a multi-level quantizer 100 for providing a snapshot of both amplitude and timing (e.g. phase or frequency) information of an input signal, received at node $V_{in}$. Appropriate pattern detection logic 140 may used to demodulate or detect the input signal based on the snapshot provided by the multi-level quantizer.

In this embodiment, an input signal is received at node $V_{in}$. and applied to a plurality of comparators 122, 124, 126, and 128 for comparison with a respective, different reference potential. Although FIG. 1 depicts the use of four (4) comparators 122–128, the particular number of comparators employed will vary from implementation to implementation, depending on how much precision in the amplitude domain is desired in a particular implementation environment. In fact, as explained in more detail hereinafter, if the input signal does not bear encoded information in the amplitude of the signal, as true for Frequency Modulation, then only a single comparator need be used.

According to one implementation, the plurality of comparators 122–124 receives a respective reference potential from a voltage divider 110. Voltage divider 110 is a chain of resistive elements 112, 114, 116, 118, and 120, coupled in series from a source of supply potential $V_{cc}$ to a source of ground potential. The resistive elements 112 to 120 may comprise resistors or any other device which exhibits a potential drop when current passes through it, such as a diode, a transistor, or any other semiconductor device having a forward or reversed biased junction. The number of resistive elements 112 to 120 employed is related to the number of comparators 122 to 128 used in the multi-level quantizer 100 in order to provide the comparators 122 to 128 with different reference potentials. If the reference potentials are neither the supply potential nor the ground potential, then there should be at least one more resistive element 112–120 than the number of comparators 122–128.

An output of each comparator 122–128 is coupled to an input of a respective delay line 132–138 for repeatedly delaying an output pulse of each comparator for a common delay period. In this manner, the comparators 122–128 quantize the amplitude information of an input signal according to a reference potential by generating a pulse based on a comparison of the input signal and the respective reference potential. The delay lines 132–138 buffer and hence capture the timing information of the pulses from the comparators 122–128.

Therefore, pattern matching logic 140 coupled to the delay lines 132–138 is able to synoptically inspect an analog signal that is quantized into pulses and buffered for signal detection or demodulation. The connections between the delay lines 132–138 and the pattern matching logic 140 depicted in FIG. 1 are merely exemplary, and the present invention is not limited to any particular set of connections. In fact, it is contemplated that the particular portions of the delay lines 132–138 to which the pattern matching logic 140 is coupled depends heavily on the desired implementation environment.

DELAY LINE

Figure 2A:
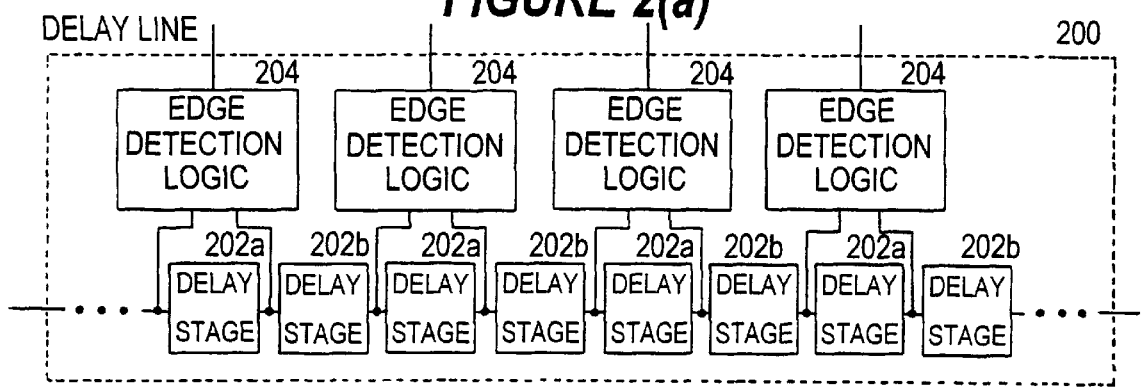
FIG. 2(a) is a block diagram of a delay line that may be used to implement the circuit depicted in FIG. 1.

More specifically, with reference to FIG. 2(a), a delay line 200 according to an embodiment of the invention comprises a chain of serially coupled delay stages 202a and 202b for repeated by delaying a signal applied to the delay line 200. Typically, the delay line will comprise tens of thousands, or more, of these delay stages 202. Coupled to an input and output of at least some of the delay stages 202a, for example after every other delay stage 202a, is edge detection logic 204 for detecting the presence of a recurring signal characteristic, preferably an edge, such as a rising edge or a falling edge in a pulse travelling down the delay line 200.

Figure 2B:
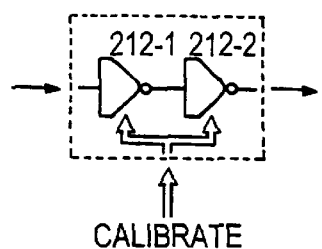
FIGS. 2(b) and 2(c) are circuit diagrams of a non-inverting delay stage and inverting delay stage that may be used to implement a delay stage depicted in FIG. 2(a).

Each delay stage 202a and 202b may be a non-inverting delay stage or an inverting delay stage. A non-inverting delay stage provides an output signal that is approximately the same as the input signal, except phase shifted by a delay period. According to one implementation, a non-inverting delay stage 210 comprises two conventional inverters coupled in series. In another implementation, depicted in FIG. 2(b), a non-inverting delay stage 210 comprises two inverting delay stages 2121-1 and 212-2, depicted in FIG. 2(c), coupled in series.

The delay characteristics of any digital circuit will vary from chip to chip and over time because of unavoidable variations in manufacturing and operating conditions. Preferably, the delay period of each constituent inverting delay stage 212-1 and 212-2 can be synchronized according to a calibration signal as explained with reference to the inverting delay stage 220 depicted in FIG. 2(c).

Figure 2C:
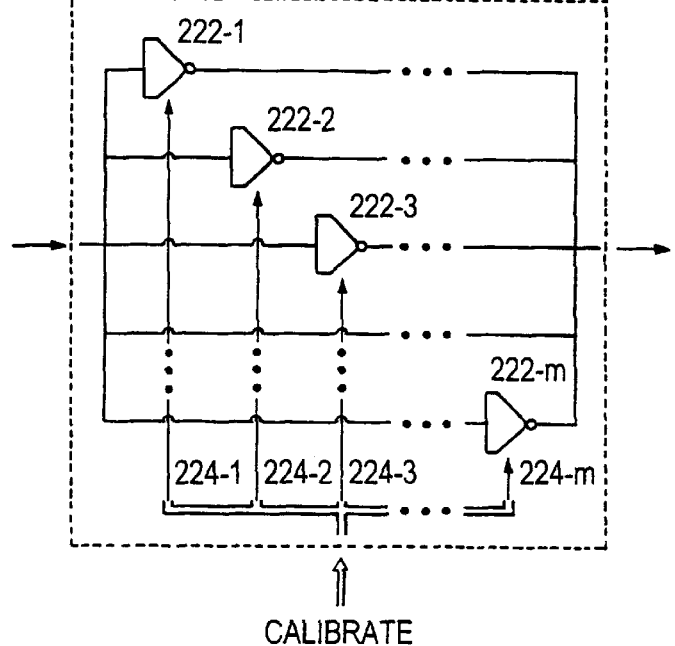

In FIG. 2(c) depicted is an adjustable, inverting delay stage 220 according to one implementation comprising a plurality of switchable inverters 222-1, 222-2, 222-3, to 222-m, which may be enabled or disabled according to a corresponding bit 224-1, 224-2, 224-3, to 224-m in a calibration signal. Enabling or disabling a switchable inverter 222 changes the amount of driving power the inverting delay stage 220 can supply to a load capacitance (not shown) and hence affects the delay time of the inverting delay stage 220. Examples of switchable inverters are described in the commonly assigned U.S. Pat. No. 5,220,216 issued to Woo on Jun. 15, 1993 and U.S. Pat. No. 5,227,679 issue to Woo on Jul. 13, 1993.

The calibration signal may be produced with reference to a reliable, precise clock signal, e.g. from a crystal oscillator, preferably by an on-chip digital servo circuit (not shown) such as described in the commonly assigned U.S. Pat. No. 5,457,719, issued to Guo et al. on Oct. 10, 1995. Briefly, the on-chip digital servo circuit comprises an adjustable digital delay line of its own, which it monitors and continually adjusts with a calibration signal in a feedback loop.

Accordingly, delay line 200 comprises a series of delay stages 202a and 202b, each of which provides a uniform delay period preferably synchronized to a reference clock period according to a calibration signal. Moreover, each inverting delay stage 220 can have a consistent delay period of as little as 70 ps. Thus, each pair delay stage 202a and 202b or each non-inverting delay stage 210 can have a consistent delay period of as little of 140 ps. Therefore, delay line 200 is high-speed, capable of processing pulses at data rates up to about 7 GHz. Furthermore, digital delay line 200 provides edge detection logic 204 for viewing synoptically any portion of a quantized input signal.

EDGE DETECTION LOGIC

As explained hereinabove, the delay line 200 preferably includes edge detection logic 204 for detecting the edge of a pulse travelling down the delay line 200. The edge detection logic 204 may detect a falling edge, a rising edge, or both edges, and generates a signal, e.g. a high voltage level, indicating the presence of the edge at a delay stage 202a associated with the edge detection logic 204. The edge detection logic 204 may be implemented according to a variety of different approaches depending on the nature of the delay stage, some of which are depicted in FIGS. 3 and 4 for non-inverting delay stages and inverting delay stages, respectively.

Figure 3A:
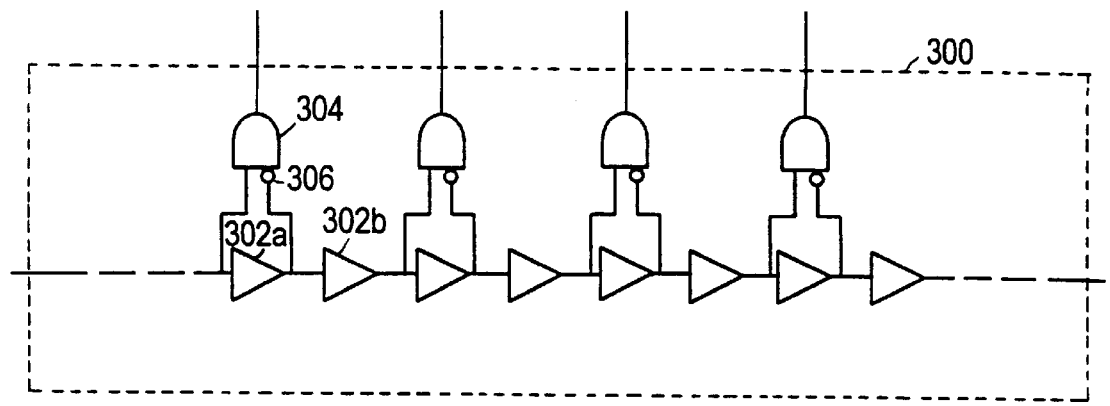
FIGS. 3(a) to 3(e) are circuit diagrams of edge detection logic that may be implemented in conjunction with a non-inverting delay stage.

Referring to FIG. 3(a), a portion of delay line 300 is implemented with non-inverting delay stages 302a and 302b and falling edge detection logic comprising an AND gate 304 and an inverter 306 coupled to the output of non-inverting delay stage 302a. The AND gate 304 is coupled to the output of the inverter 306 and the input of the non-inverting delay stage 302a. When a falling edge of a pulse is being delayed by non-inverting delay stage 302a, the input of the non-inverting delay stage 302a has a high potential level, but the output thereof has a low potential level. Accordingly, the output of inverter 306 in this situation is at a high level and the output of AND gate 304 is high. Preferably, the delay period of inverter 306 is very short compared to the delay period of the non-inverting delay stage 302a for detecting the edge being delayed. When a falling edge of a pulse is not being delayed by the non-inverting delay stage 302a, then one of the inputs to AND gate 304 is low, resulting in a low level output. Therefore, a high output of AND gate 304 indicates the presence of a falling edge in a pulse at the delay element 302a and a low output indicates the absence of a falling edge in the pulse at the delay element 302a.

Figure 3B:
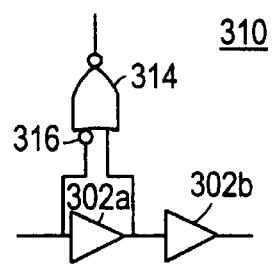

In FIG. 3(b), another implementation of falling edge logic is depicted, comprising an inverter 316 coupled to the input of non-inverting delay stage 302a and a NOR gate 314 coupled to the output of the inverter 316 and the output of the non-inverting delay stage 302a. In this configuration, the output of NOR gate 314 is high only when both inputs are low, that is, when the input to the non-inverting delay stage 302a is currently high and inverted by inverter 316 and when the output of the non-inverting delay stage 302a is currently low. Therefore, the configuration depicted in FIG. 3(b) also provides falling edge detection logic. Persons of skill in the art would readily recognize that if the output of the edge detection logic is in the form of "negative logic," i.e. a low level indicating only the presence of a falling edge, then a NAND gate (not shown) and an OR gate (not shown) would be employed in place of AND gate 304 and NOR gate 314, respectively.

Figure 3C:
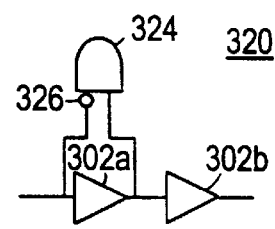
Figure 3D:
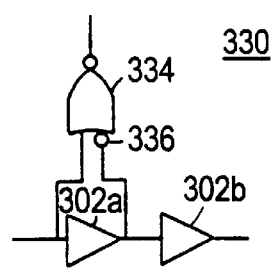

FIGS. 3(c) and 3(d) depict two implementations of rising edge detection logic 320 and 330. In these implementations 320 and 330, rising edge detection logic is provided by inverting the other input of the gate in the respective falling edge detection logic 300 and 310. Specifically, in FIG. 3(c) the input to the non-inverting delay stage 302a is inverted by inverter 326 and applied to AND gate 324, whose other input is coupled to the output of the non-inverting delay stage 302a. Thus, the output of AND gate 324 is high only when both inputs are high, that is, when the input to the non-inverting delay stage 302a is currently low and inverted by inverter 326 and when the output of the non-inverting delay stage 302a is currently high.

Moreover, in FIG. 3(d) the output to the non-inverting delay stage 302a is inverted by inverter 336 and applied to NOR gate 334, whose other input is coupled to the input of the non-inverting delay stage 302a. Thus, the output of NOR gate 334 is high only when both inputs are low, that is, when the output to the non-inverting delay stage 302a is currently high and inverted by inverter 336 and when the input of the non-inverting delay stage 302a is currently low. Persons of skill in the art would readily recognize that if the output of the edge detection logic is in the form of "negative logic," i.e. a low level indicating only the presence of a rising edge, then a NAND gate (not shown) and an OR (not shown) would be employed in place of AND gate 324 and NOR gate 334, respectively.

Figure 3E:
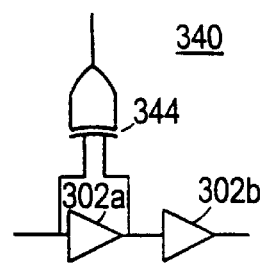

Referring to FIG. 3(e) depicted is edge detection logic 340 for detecting both rising and falling edges in a pulse currently being delayed by delay stage 302a. Specifically, edge detection logic 340 comprises an exclusive OR (XOR) gate 344, which outputs a high level only if the level of one of the inputs is different from the other, that is, when either edge, rising or falling, is currently being delayed by delay stage 302a. Persons of skill in the art would readily recognize that if the output of the edge detection logic 340 is in the form of "negative logic," i.e. a low level indicating only the presence of a rising edge, then an XNOR gate (exclusive nor, not shown) would be employed in place of XOR gate 344.

Figure 4A:
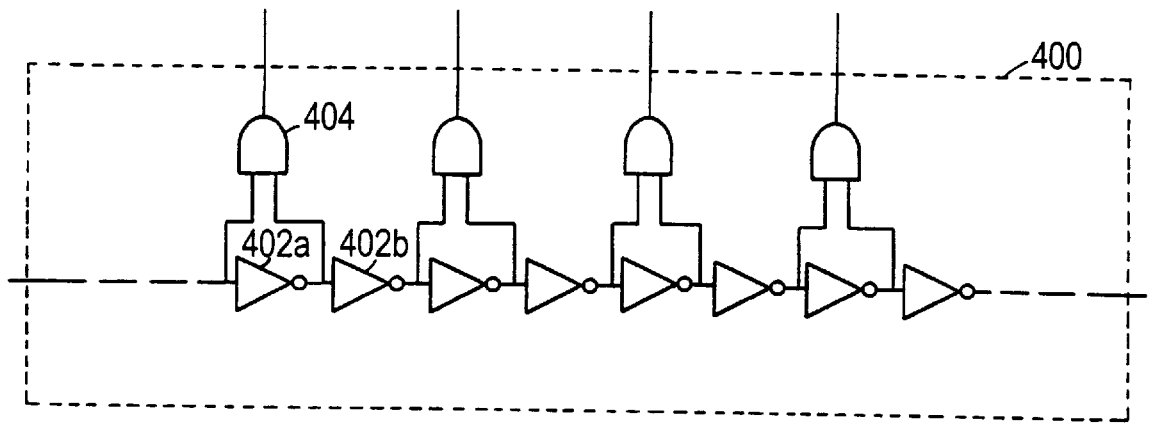
FIGS. 4(a) to 4(c) are circuit diagrams of edge detection logic that may be implemented in conjunction with an inverting delay stage.
Figure 4B:
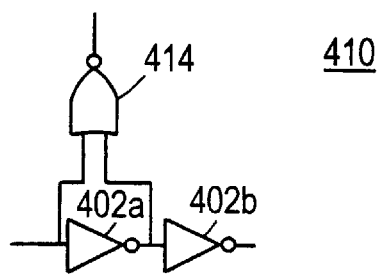
Figure 4C:
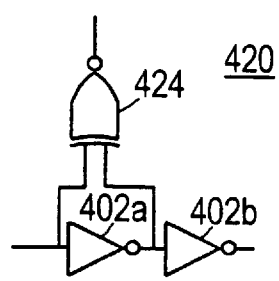

If, on the other hand, the delay stages 202a and 202b are implemented by inverting delay stages 220, then the edge detection logic 204 may be implemented according to the configurations depicted in FIGS. 4(a) to 4(c). In FIG. 4(a), falling edge detection logic 400 may be implemented with an AND gate 404 coupled to the input and output of inverting delay stage 402a. The AND gate 404 outputs a high level only if both inputs are high, that is, if the input to inverting delay stage 402a is high and the inverted output of inverting delay stage 402a is high, which occurs when there is a falling edge in the pulse currently delayed by delay state 402a.

Similarly, a NOR gate 414 in FIG. 4(b) coupled to the input and the output of inverting delay stage 402a can detect the presence of rising edges and XNOR gate 424 in FIG. 4(c) coupled to the input and the output of inverting delay stage 402a can detect the presence of either a falling edge or a rising edge in a pulse. Persons of skill in the art would readily recognize that if the output of the edge detection logic is in the form of "negative logic," i.e. a low level indicating only the presence of an edge, then a NAND gate (not shown), an OR (not shown), and an XOR gate (not shown) would be employed in place of AND gate 404, NOR gate 414, and XNOR gate 424, respectively.

MULTI-LEVEL QUANTIZER FOR DETECTING SIGNALS

The multi-level quantizer 100 illustrated in FIG. 1 may be used for detecting non-periodic signals. For example, an analog signal varying over time, such as the signal depicted in the graph of FIG. 5(a) may be applied to input node $V_{in}$ and thence to each comparator 122–128. In response, each comparator compares the applied input analog signal to a different reference potential and produces therefrom a digital pulse based on a comparison of the voltage if the input analog signal exceeds the voltage of the reference potential. There are a variety of approaches to producing the pulse based on the comparison.

Figure 5:
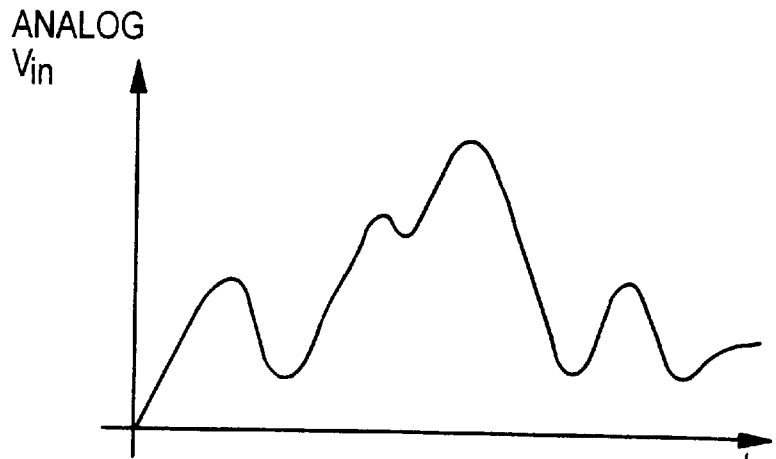
FIGS. 5(a) to 5(c) are graphs illustrating an operation of the embodiment of the invention depicted in FIG. 1.
Figure 5:
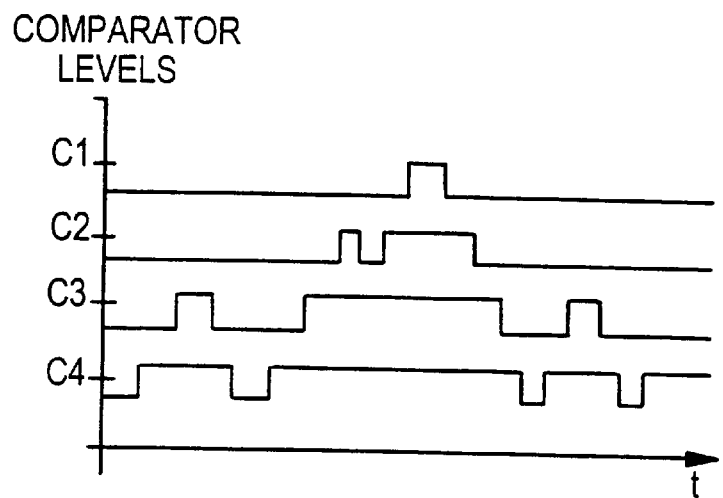
Figure 5:
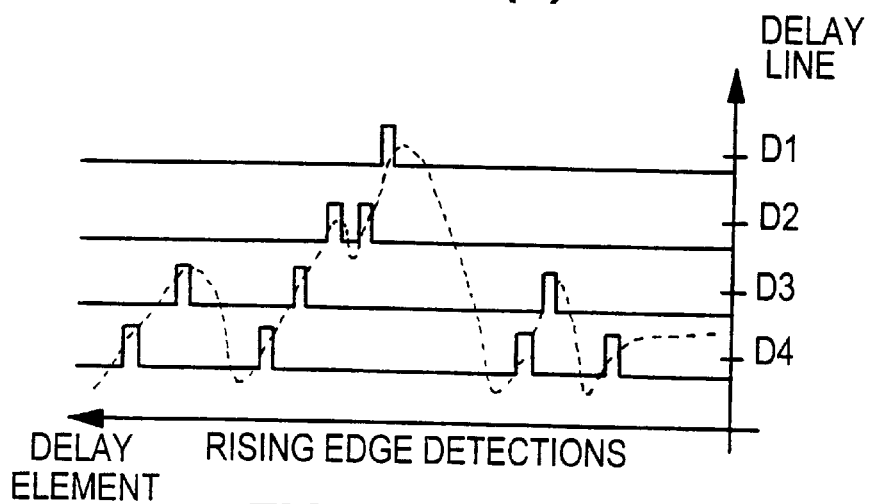

According to one possible approach illustrated in FIG. 5(b), each comparator 122–128 generates a pulse for the duration in which the input analog voltage exceeds the voltage of the reference potential. According to another approach, however, the comparators 122–128 may be configured to output a pulse only for the time in which the input voltage is within a small potential window, e.g. 0.1 V, of the reference potential.

In the first approach, since the reference potentials are produced from a voltage divider 110, comparator 122 (C1) generates a pulse only when the analog signal attains a relatively high voltage level, but comparator 128 (C4), on the other hand, generates a pulse when the analog signal reaches a lower voltage level. In this configuration, an upper level comparator, e.g. comparator 122, outputs a pulse only when a lower level comparator, e.g. comparator 128, is also outputting a pulse.

The pulses produced from the comparators 122–128 are applied to a corresponding delay line 132–138 and are repeatedly delayed for a common delay period by successive delay stages in the delay line. The edge detection logic at various stages in the delay line output a signal indicative of the presence of an edge of a pulse in the delay line at the delay stage. For example, in FIG. 5(c), depicted is a snapshot of the rising edge detections at a particular point in time. Thus, each delay line through its edge detection logic outputs signals indicative of detected edges at a delay stage corresponding to transitions of the input signal across a reference potential. Earlier transitions propagate further down in the delay line than later transitions. Accordingly, the edge detection signals at various stages in the delay line provide time-based information of the behavior of the input analog signal.

Therefore, each delay line provides a snapshot of time-based information for transitions across a particular reference potential, and the use of a plurality delay lines for a plurality reference potentials provides amplitude information for the input signal. Consequently, the multi-level quantizer 100 can be monitored by pattern detection logic 140 at a point in time and thus detect an incoming signal.

As evident from the graph, every rising edge detected within a delay line indicates an upward transition of input signal across the reference potential of the corresponding comparator. Moreover, rising edge detections at subsequent delay stages imply, by an assumption of continuity, that there was a downward transition across the reference potential in the input signal. Therefore, the information about the detected rising edges is sufficient to reconstruct the analog input signal within the precision in the amplitude domain afforded by the number of comparators. Likewise, information about detected falling edges or both rising and falling edges combined can be used to reconstruct the input signal. Consequently, multi-level quantizer 100 can be used to implement a generic demodulator.

Greater precision in the amplitude domain may be achieved by adding more delay lines in parallel in conjunction with additional comparators for comparing the input signal to additional reference potentials. Greater precision in the timing domain may be attained by using or calibrating the delay stages to a shorter delay period. Another approach in obtaining greater timing precision is to detect both upward and downward transitions in the input signal, e.g. by detecting both rising and falling edges or by generating short pulses from the comparator when the voltage of the analog input signal is within a small window of the reference potential. Consequently, a scalable signal detector or demodulator is advantageously attained by the present invention.

MULTI-LEVEL QUANTIZER FOR PERIODIC SIGNALS

Occasionally, input signals are corrupted with noise and tend to have more "jitter" than clean signals. Jitter manifests itself in the delay lines by causing an edge detection signal to be generated at a delay stage or two before or after the delay stage at which the edge would have been detected in a clean signal. According to one embodiment of the present invention, the random effects of jitter of a periodic signal are counted and averaged out.

Figure 6:
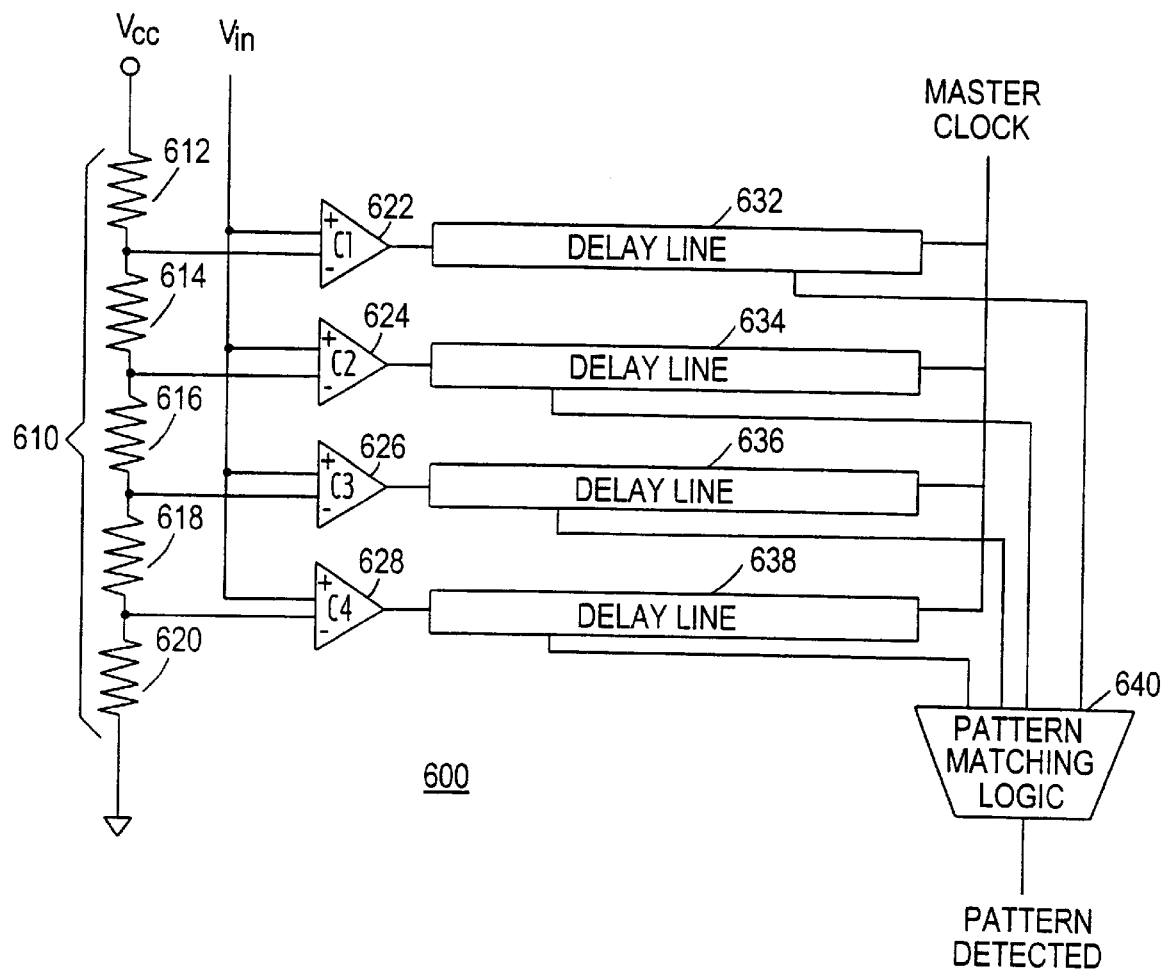
FIG. 6 is a circuit diagram of a signal detection circuit according to another embodiment.

Referring to FIG. 6, depicted is a multi-level quantizer 600, comprising a voltage divider 610 with resistive elements 612, 614, 614, 618, and 620 coupled in series between a supply potential $V_{cc}$ and ground. The voltage divider 610 includes taps between the resistive elements 612–620, which are coupled to corresponding comparators 622, 624, 626, and 628 for providing respective reference potentials thereto. Each comparator 622–628 is configured to receive an analog input signal from node $V_{in}$ and compare the voltage of the analog input signal to the voltage of the reference potential. In response, each comparator 622–628 generates a pulse based on the voltage comparisons.

The output of each comparator 622–628 is coupled to a corresponding delay line 632, 634, 636, and 638 for repeatedly delaying the pulses from the comparators 622–628. As explained in more detail hereinafter, each delay line 632–638 is configured to detect edges of the pulses and count the detected edges in response to a master clock signal. Pattern matching logic 640 may be coupled to various outputs of the delay lines 632–638 to access the edge counts for use in detecting a signal.

Figure 7:
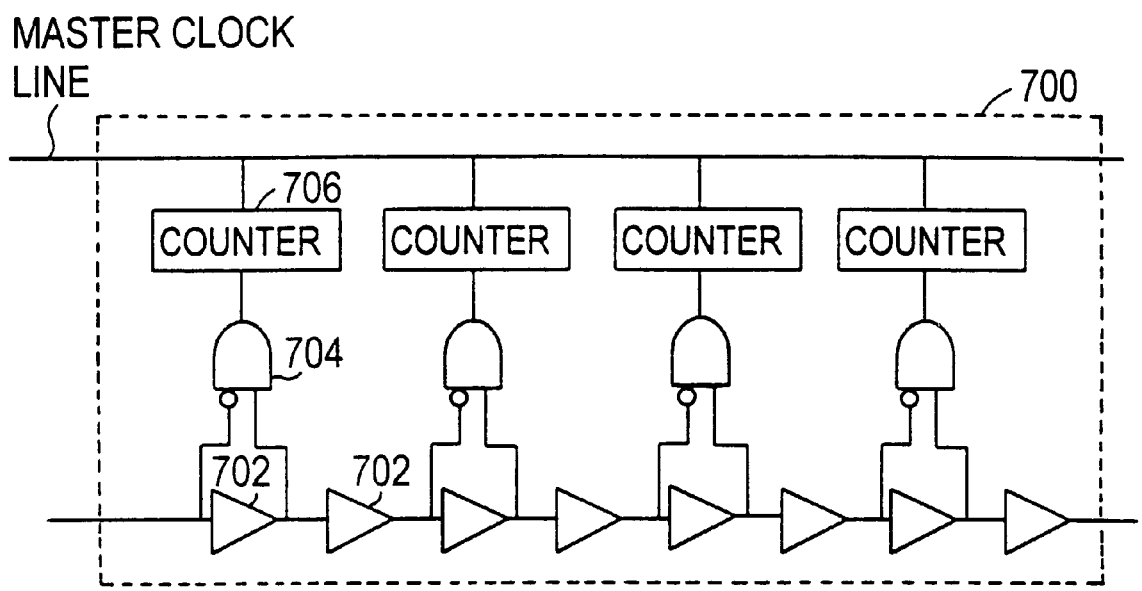
FIG. 7 is a circuit diagram of a delay line that may be used to implement the signal detection circuit depicted in FIG. 6.

Referring to FIG. 7, illustrated is an exemplary delay line 700, which can be used to implement the delay lines 632–638. The exemplary delay line 700 includes a chain of serially coupled delay stages 702 with edge detection logic 704 coupled to an input and output of a delay stage 702. In the example, the exemplary delay line 700 is implemented with non-inverting delay stages and rising edge detection logic, but it is evident that the delay line 700 may be implemented with other kinds of delay stage stages, for example inverting delay stages, and various kinds and species of edge detection logic, for example falling edge detection logic.

The output of the edge detection logic 704 is coupled to a counter 706, which is configured to increment when the edge detection logic indicates a detected edge and a clock signal asserted on a master clock line. The master clock signal may be synchronized to the periodic input signal, e.g. the period of the master clock signal is an integral number of input signal periods. For example, in FIG. 8(a) depicted is an exemplary periodic input signal with a synchronized master clock signal asserted at times $t_1$ to $t_8$, occurring at approximately the same point in the periodic input signal. Thus, the output pulses of each comparator 622–628 are roughly periodic as shown in FIG. 8(b) and generate edges at approximately the same delay stage when the master clock signal is asserted. For example, comparator 626 (C3) over the course of eight master clock periods may generate pulses that cause the fifth delay stage to increment a corresponding counter twice, the sixth delay stage three times, and the seventh delay stage once.

Accordingly, the counters will tend to accumulate edges at the location of transitions in the input signals. If there is jitter in the periodic input signal, then adjacent counters near the location of the edge will also contain a number of counts. The combination of these adjacent counters can be viewed as a "histogram" of detected edges. In the example as illustrated in FIG. 8(c), after eight master clock periods the counters of delay line 636 (D3) corresponding to comparator 626 (C3) may indicate a histogram of two counts at the sixth delay stage, three counts at the seventh delay stage, and one count at the eight delay stage.

These histograms associated with transitions in the input signal across a reference potential provide valuable information about the quality of the input signal. This information may be used by other components in a communications system to make intelligent decisions concerning the operation of the system. For example, the observation of excessive (according to some empirically predefined threshold) counts in an adjacent counter may indicate that the overall signal to noise ratio in the channel of the input signal has degraded. The system may respond by such actions as boosting the transmission power or increasing the level of error correction in signal detection.

DEMODULATING DIGITAL DATA

As explained hereinabove, some implementations of multi-level quantizers 100 and 600 include a plurality of comparators and associated delay lines for capturing information contained in the amplitude components of the input signal. Certain kinds of modulation, for example frequency modulation (FM) or frequency shift keying (FSK), on the other hand, do not encode information in the amplitude of the transmitted signal but in changes in the timing of the signal.

In this case, a single delay line, such as delay line 200 or 700, suffices for capturing the timing information of the signal. If the voltage swing of the input signal already matches the voltage range of the delay line (e.g. 0 V–5 V), then the input signal can be applied directly to the delay line. On the other hand, if the voltage swings do not match, then a single comparator with an appropriately predefined reference voltage may be used to convert the logical levels of the input signal.

While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. A circuit for detecting a digital signal, comprising:
   a plurality of delay stages coupled in series;
   edge detection logic coupled to an input of a delay stage from among said delay stages and an output of the delay stage for outputting a signal indicative of a prescribed characteristic of the digital signal; and
   a counter coupled to the edge detection logic for counting, in response to a master clock signal, the prescribed characteristic of the digital signal based on the signal output from the edge detection logic.

2. The circuit of claim 1, wherein the prescribed characteristic of the digital signal is an edge in the digital signal.

3. The circuit of claim 1, wherein the delay stage includes a non-inverting delay stage.

4. The circuit of claim 3, wherein the edge detection logic includes an XOR gate coupled to the input and output of the non-inverting delay stage.

5. The circuit of claim 3, wherein the edge detection logic includes an inverter coupled to the output of the non-inverting delay stage.

6. The circuit of claim 5, wherein the edge detection logic further includes an AND gate coupled to an output of the inverter and the input of the non-inverting delay stage.

7. The circuit of claim 5, wherein the edge detection logic further includes a NOR gate coupled to an output of the inverter and the input of the non-inverting delay stage.

8. The circuit of claim 3, wherein the edge detection logic includes an inverter coupled to the input of the non-inverting delay stage.

9. The circuit of claim 8, wherein the edge detection logic further includes an AND gate coupled to an output of the inverter and the output of the non-inverting delay stage.

10. The circuit of claim 8, wherein the edge detection logic further includes a NOR gate coupled to an output of the inverter and the output of the non-inverting delay stage.

11. The circuit of claim 3, wherein the non-inverting delay stage includes a pair of inverting delay stages coupled in series.

12. The circuit of claim 1, wherein the delay stage includes an inverting delay stage.

13. The circuit of claim 12, wherein the edge detection logic includes an XNOR gate coupled to the input of the inverting delay stage and the output of the inverting delay stage.

14. The circuit of claim 12, wherein the edge detection logic further includes an AND gate coupled to the output of the inverting delay stage and the input of the inverting delay stage.

15. The circuit of claim 12, wherein the edge detection logic further includes a NOR gate coupled to the output of the inverting delay stage and the input of the inverting delay stage.

16. The circuit of claim 1, wherein the edge detection logic includes an inverter coupled to the input of the delay stage.

17. The circuit of claim 16, wherein the edge detection logic further includes an AND gate coupled to an output of the inverter and the output of the delay stage.

18. The circuit of claim 16, wherein the edge detection logic further includes a NOR gate coupled to an output of the inverter and the output of the delay stage.

19. The circuit of claim 1, wherein each delay stage is configured to receive a calibration signal and in response vary a delay period of said stage.

20. A circuit for detecting an input signal, comprising:
   one or more comparators for comparing the input signal with a respective reference potential and producing therefrom pulses indicative of a comparison of the input signal and the respective reference potential; and
   one or more digital delay lines, coupled to outputs of the respective comparators, for delaying respective pulses from the comparator and including detection logic for producing signals indicative of a prescribed characteristic in the pulses.

21. The circuit of claim 20, wherein the detection logic includes rising edge detection logic.

22. The circuit of claim 20, wherein the detection logic includes falling edge detection logic.

23. The circuit of claim 20, further comprising a plurality of counters responsive to a clock signal, coupled to the one or more digital delay lines, and configured to count a number of the prescribed characteristics.

24. The circuit of claim 20, further comprising a voltage divider including a serially coupled chain of resistive elements between a supply potential source and a ground potential source for supplying the plurality of respective reference potentials to the respective comparators.

25. The circuit of claim 24, wherein the resistive elements include a resistor.

26. The circuit of claim 24, wherein the resistive elements include a biased semiconductor junction.

27. The circuit of claim 20, further comprising means for supplying the plurality of respective reference potentials to the respective comparators.

28. A method of detecting a signal, comprising the steps of:

comparing the signal to a plurality of reference potentials to produce therefrom a plurality of corresponding pulses;

repeatedly delaying by a common delay period the plurality of pulses; and detecting a prescribed characteristic in the plurality of delayed pulses.

29. The method of claim 28, wherein the step of detecting a prescribed characteristic in the plurality of delayed pulses includes the step of detecting edges in the plurality of delayed pulses.

30. The method of claim 29, wherein the step of detecting edges includes the step of detecting falling edges in the plurality of delayed pulses.

31. The method of claim 29, wherein the step of detecting edges includes the step of detecting rising edges in the plurality of delayed pulses.

32. The method of claim 29, further comprising the step of counting the detected edges.

33. The method of claim 32, further comprising the step of synchronizing a clock signal to a period of the signal, wherein the step of counting the detected edges includes the step of counting the detected edges based on the synchronized clock signal.

34. The method of claim 28, further comprising the step of supplying the plurality of reference potentials.

35. The method of claim 28, further comprising the step of calibrating the common delay period.

* * * * *